(12) United States Patent
Song et al.

(10) Patent No.: US 12,707,870 B2
(45) Date of Patent: Aug. 11, 2026

(54) DISPLAY DEVICE

(71) Applicant: Samsung Display Co., LTD., Yongin-si (KR)

(72) Inventors: Jinouk Song, Yongin-si (KR); Ilhoo Park, Yongin-si (KR); Jin Sook Bang, Yongin-si (KR); Sang Hoon Yim, Yongin-si (KR); Seong Jin Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 363 days.

(21) Appl. No.: 18/458,852

(22) Filed: Aug. 30, 2023

(65) Prior Publication Data

US 2024/0138242 A1 Apr. 25, 2024
US 2024/0237500 A9 Jul. 11, 2024

(30) Foreign Application Priority Data

Oct. 20, 2022 (KR) ........................ 10-2022-0135708

(51) Int. Cl.
*H10K 59/122* (2023.01)
*H10K 59/40* (2023.01)
*H10K 59/80* (2023.01)

(52) U.S. Cl.
CPC ....... *H10K 59/8791* (2023.02); *H10K 59/122* (2023.02); *H10K 59/40* (2023.02); *H10K 59/873* (2023.02); *H10K 59/879* (2023.02)

(58) Field of Classification Search
CPC ......................... H10K 59/8791; H10K 59/122
USPC .................................................. 313/498–512
See application file for complete search history.

(56) References Cited

U.S. PATENT DOCUMENTS

2017/0149018 A1* 5/2017 Choi ...................... H10K 50/86
2017/0154930 A1* 6/2017 Kim ..................... G02B 27/022
2018/0149872 A1* 5/2018 Choi .................... G02B 27/017
2019/0165061 A1* 5/2019 Jung .................... H10K 59/879
2020/0105846 A1 4/2020 Liu et al.
2020/0350516 A1 11/2020 An et al.
2022/0013607 A1* 1/2022 Lee ...................... H10K 59/124
2022/0131111 A1 4/2022 Lee et al.
2022/0173361 A1* 6/2022 Cho ........................ H10K 59/40
2022/0199949 A1* 6/2022 Jung ....................... H10K 59/40
(Continued)

FOREIGN PATENT DOCUMENTS

KR 10-2016-0021335 A 2/2016
KR 10-2017-0060216 A 6/2017
KR 10-2017-0062904 A 6/2017
(Continued)

*Primary Examiner* — Christopher M Raabe
(74) *Attorney, Agent, or Firm* — Womble Bond Dickinson (US) LLP

(57) ABSTRACT

A display device according to an embodiment includes: a substrate; a transistor on the substrate; a pixel electrode electrically connected to the transistor; a pixel defining layer on the pixel electrode and having a first opening overlapping the pixel electrode; an emission layer on the pixel electrode; a common electrode on the pixel definition layer and the emission layer; an encapsulation layer on the common electrode; a light extraction pattern on the encapsulation layer and having a first refractive index; and a reflection control layer covering the light extraction pattern and having a second refractive index different from the first refractive index.

19 Claims, 11 Drawing Sheets

(56) References Cited

U.S. PATENT DOCUMENTS

| | | | |
|---|---|---|---|
| 2022/0238841 A1 | 7/2022 | Lee et al. | |
| 2022/0285655 A1* | 9/2022 | Lee | H10K 59/878 |

FOREIGN PATENT DOCUMENTS

| | | |
|---|---|---|
| KR | 10-2019-0062678 A | 6/2019 |
| KR | 10-2020-0127103 A | 11/2020 |
| KR | 10-2022-0056929 A | 5/2022 |
| KR | 10-2022-0109550 A | 8/2022 |

* cited by examiner

DISPLAY DEVICE

CROSS-REFERENCE TO RELATED APPLICATION

This application claims priority to and the benefit of Korean Patent Application No. 10-2022-0135708 filed in the Korean Intellectual Property Office on Oct. 20, 2022, the entire contents of which are hereby incorporated by reference.

BACKGROUND

1. Field

Embodiments of this disclosure relate to a display device, and, for example, to a display device that can reduce external light reflection while improving light emission efficiency.

2. Description of the Related Art

A display device such as a light emitting display device is applied to an electronic device such as a smart phone, a mobile phone, a tablet PC, a monitor, a television, a multimedia player, and a video game console.

The display device includes light emitting elements on a substrate and circuit elements for driving the light emitting elements. The light emitting elements form pixels, and an image can be displayed by a combination of light emitted from the light emitting elements and emitted to the outside of the display device.

The above information disclosed in this Background section is only for enhancement of understanding of the background, and therefore it may contain information that does not form the prior art that is already known in this country to a person of ordinary skill in the art.

SUMMARY

Some of the light emitted from a light emitting element of a display device may disappear or be attenuated without being emitted from the display device. Due to this, light emission efficiency and display of the display device may be deteriorated or reduced.

Embodiments of the present disclosure provide a display device that can improve light emission efficiency and front luminance and reduce external light reflection.

A display device according to an embodiment includes: a substrate; a transistor on the substrate; a pixel electrode electrically connected to the transistor; a pixel defining layer on the pixel electrode and having a first opening overlapping the pixel electrode; an emission layer on the pixel electrode; a common electrode on the pixel definition layer and the emission layer; an encapsulation layer on the common electrode; a light extraction pattern on the encapsulation layer and having a first refractive index; and a reflection control layer covering the light extraction pattern and having a second refractive index different from the first refractive index.

The reflection control layer may contact the light extraction pattern.

The light extraction pattern may have a mesh shape or a lattice shape.

The light extraction pattern may have a cross-section shape of a trapezoid.

The light extraction pattern may include a microlens array.

The second refractive index may be greater than the first refractive index.

The second refractive index may be smaller than the first refractive index.

The reflection control layer may contain tetraazaporphyrin.

The reflection control layer may have a second opening overlapping the first opening.

The display device may further include a flattening layer at least in the second opening and having a third refractive index.

The third refractive index may be the same as the second refractive index.

The third refractive index may be greater than the second refractive index.

The flattening layer may include a portion in the second opening and a portion on the reflection control layer.

An upper surface of the reflection control layer and an upper surface of the flattening layer may form a flat surface.

The display device may further include: a touch conductive layer on the encapsulation layer; and an insulation layer on the touch conductive layer. The light extraction pattern may be on the insulation layer.

A display device according to an embodiment includes: a substrate; a transistor on the substrate; a pixel electrode electrically connected to the transistor; a pixel defining layer on the pixel electrode and having an opening overlapping the pixel electrode; an emission layer on the pixel electrode; a common electrode on the pixel definition layer and the emission layer; an encapsulation layer on the common electrode; a reflection control layer on the encapsulation layer, including scatterers, and having a second opening overlapping the first opening; and a flattening layer in at least the second opening.

The scatterers may be distributed at less than ⅔ or less of a height of the reflection control layer in the reflection control layer.

The reflection control layer may contain tetraazaporphyrin.

The display device may further include: a touch conductive layer on the encapsulation layer; and an insulation layer on the touch conductive layer. The reflection control layer may be on the insulation layer.

The display device may further include a light blocking member overlapping the reflection control layer.

According to the embodiments, light emission efficiency and front luminance of a display device can be improved, and external light reflection can be reduced. In addition, according to the embodiments disclosed herein, there are features that can be recognized throughout the specification.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
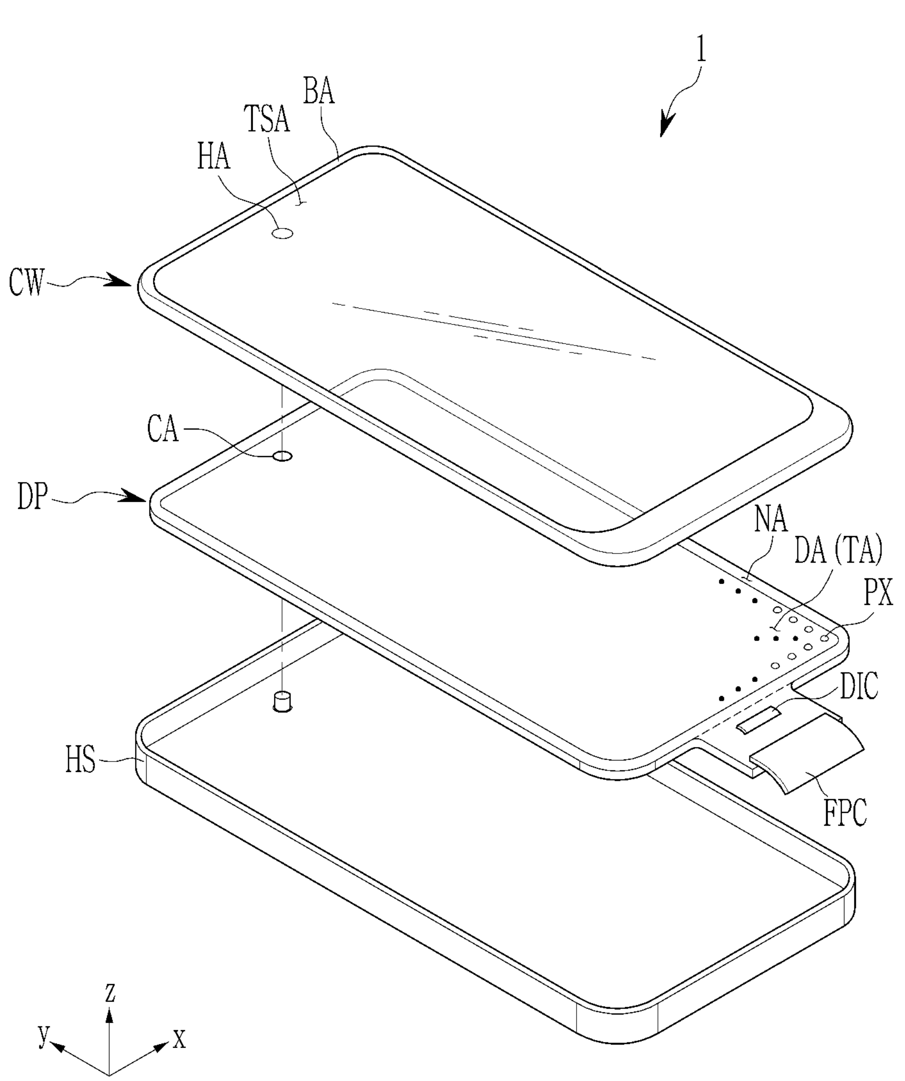
FIG. 1 is a schematic exploded perspective view of a display device according to an embodiment.

With reference to the accompanying drawing, the embodiments will be described in more detail such that a person of an ordinary skill can easily practice them in the technical field to which the present disclosure belongs.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the specification as a whole, it means that a part may contain other constituent elements as long as it is not stated to the contrary that a part "contains" a certain constituent element.

Throughout the specification, when two or more constituent elements are referred to as "connected", this does not only mean that the two or more constituent elements are directly connected, but may mean that two or more constituent elements are indirectly connected through another constituent element, are physically connected, electrically connected, or are integrated even though two or more constituent elements are referred as different names depending on a location and a function.

In the drawings, the symbols "x", "y" and "z" are used to indicate direction, where "x" is a first direction, "y" is a second direction perpendicular (e.g., substantially perpendicular) to the first direction, and "z" is a direction perpendicular (e.g., substantially perpendicular) to the first direction and the second direction.

FIG. 1 is a schematic exploded perspective view of a display device according to an embodiment.

Referring to FIG. 1, a display device 1 may be applied to an electronic device such as a smart phone, a mobile phone, a tablet, a multimedia player, a laptop, a monitor, and/or a game machine. The display device 1 may be rigid. The display device 1 may include a flexible part that can be bent, folded, rolled, and/or the like. The display device 1 may display an image in a third direction z corresponding to a front on a plane defined by a first direction x and a second direction y. The display device 1 may include a display panel DP, a cover window CW, an electronic module MD, and a housing HS.

The display panel DP may include a display area DA and a non-display area NA. The display area DA is a region where an image is displayed and may correspond to a screen. The non-display area NA is a region in which an image is not displayed and may surround at least a part of the display area DA.

The display panel DP may include pixels PX arranged in the display area DA, the pixels PX may include a red pixel, a green pixel, and a blue pixel, and the display panel DP may display an image by a combination of the pixels PX. The display panel DP may include pixel circuits and signal lines (e.g., a gate line, a data line, a driving voltage line, a common voltage line, an initialization voltage line, etc.) for driving the pixels PX. The display panel DP may be a light emitting display panel including light emitting diodes, and each light emitting diode may constitute a pixel PX. The pixel circuits may generate a driving current based on signals applied through signal lines and apply it to a light emitting diode. The display panel DP may include a touch sensor layer that can detect a touch, and the touch sensor layer may include touch electrodes.

The display panel DP may include a component area CA. The component area CA may have higher transmittance than the display area DA. Here, the term "transmittance" may mean the transmittance of light passing through the display panel DP in a third direction z. The light may be light of a wavelength other than that of visible light (e.g., infrared light) and/or may be visible light. The component area CA may have a smaller pixel PX density than the display area DA, for example, the number of pixels PX per unit area. The component area CA may not include pixels PX.

The component area CA may be provided in various suitable ways. In the illustrated embodiment, the component area CA is within the display area DA and is surrounded by the display area DA. The component area CA may be in contact with the non-display area NA. The component area CA may be at the center, left, and/or right of the top of the display area DA. The component area CA may be separated into two or more areas. The component area CA may be located along the first direction x completely across the top of the display area DA. The component area CA may be located along the second direction y across the left end and/or right end of the display area DA. The component area CA may have various suitable shapes such as polygons such as, for example a quadrangle or a triangle, a circle, or an ellipse.

The display panel DP may include a touch sensing area TA that can sense a touch, and the touch sensing area TA may be the same as or substantially coincide with the display area DA. The display panel DP may be referred to as a touch screen panel. The touch electrodes may be arranged in the touch sensing area TA, and the touch electrodes may sense a user's contact or non-contact touch. The touch electrodes may sense a touch in a self-capacitance method or a touch in a mutual capacitance method. The display device 1 may include a touch driver that generates signals for driving touch electrodes and processes signals received from the touch electrodes, and the touch driver may be provided as an IC chip.

A driver that generates and/or processes various suitable signals to drive the pixels PX may be in the non-display area NA of the display panel DP. For example, the driver may include a data driver DIC that applies a data voltage to pixels PX, a gate driver that applies a gate signal to the pixels PX, and a controller that controls the data driver DIC and the gate driver. The gate driver may be integrated into the non-display area NA. The data driver DIC is provided in the form of an IC chip and may be mounted on the non-display area NA. The data driver DIC, the touch driver and/or the controller may be provided to a flexible printed circuit film FPC and electrically connected to the display panel DP.

The cover window CW may be on the display panel DP to protect the display panel DP from external impact, and may transmit the image displayed on the display panel DP. The cover window CW may be attached to the display panel DP by an adhesive such as an optically clear adhesive (OCA) and/or an optically clear resin (OCR). The cover window CW may be coated on the display panel DP. The cover window CW may include a transmissive area TSA and a blocking area BA. The transmissive area TSA is an optically transparent area and may transmit incident light. The blocking area BA may have lower light transmittance than the transmissive area TSA. The blocking area BA may define the shape of the transmissive area TSA. The blocking area BA may surround the transmissive area TSA. The blocking area BA may represent a set or predetermined color. The blocking area BA overlaps with the non-display area NA of the display panel DP to block the non-display area NA from being visually recognized from the outside (or may reduce visibility of the non-display area NA from the outside).

The cover window CW may include a hole area HA. The hole area HA may overlap with an electronic module MD. The electronic module MD may operate by receiving external signals provided through the hole area HA. The hole area HA may be in the transmissive area TSA. In the hole area HA, a set or predetermined depression recessed from the back of the cover window CW may be defined. The recessed portion may include a groove having a smaller depth than a thickness of the cover window CW. The hole area HA may overlap with the component area CA of the display panel DP. The position and number of hole areas can be variously changed.

The electronic module MD may include various suitable functional modules related to the operation of the display device 1. The electronic module MD may be electrically connected to the display panel DP through a connector and/or the like. The electronic module MD may be a light emitting module, a light sensing module, and/or a photographing module. For example, the electronic module MD may be a camera module, and may capture a subject received through the hole area HA and the component area CA.

The housing HS may be combined with the cover window CW to form the appearance of the display device 1. The housing HS may be made of a material with high rigidity such as metal, glass, and/or plastic. The display panel DP and the electronic module MD may be in an inner space of the display device 1, which is limited by the cover window CW and the housing HS.

Figure 2:
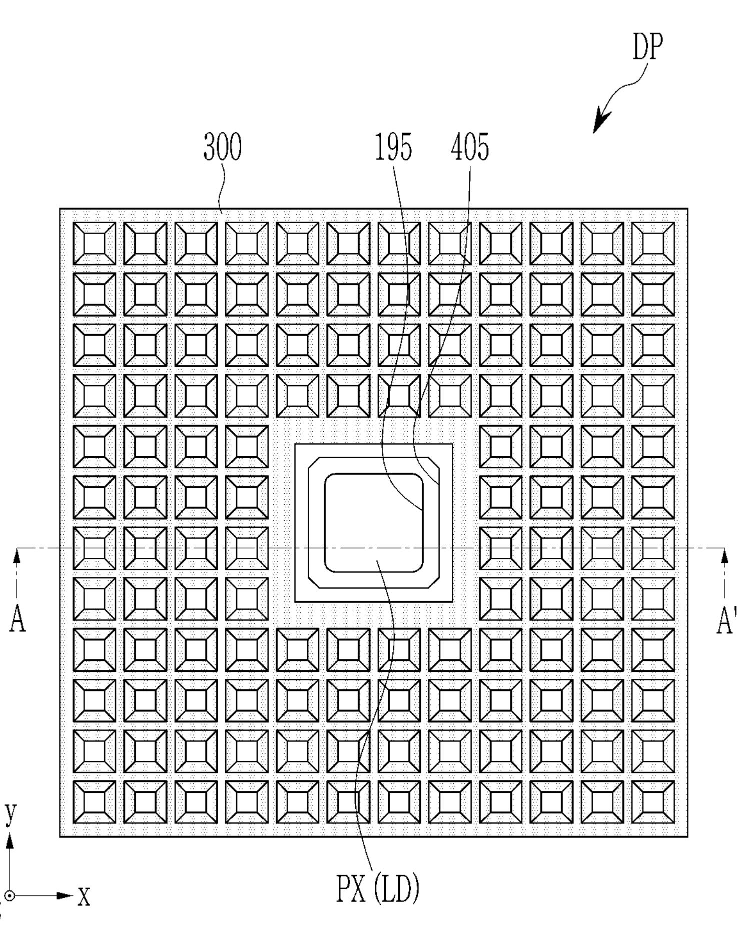
FIG. 2 is a schematic top plan view of a pixel in the display panel according to an embodiment.
Figure 3:
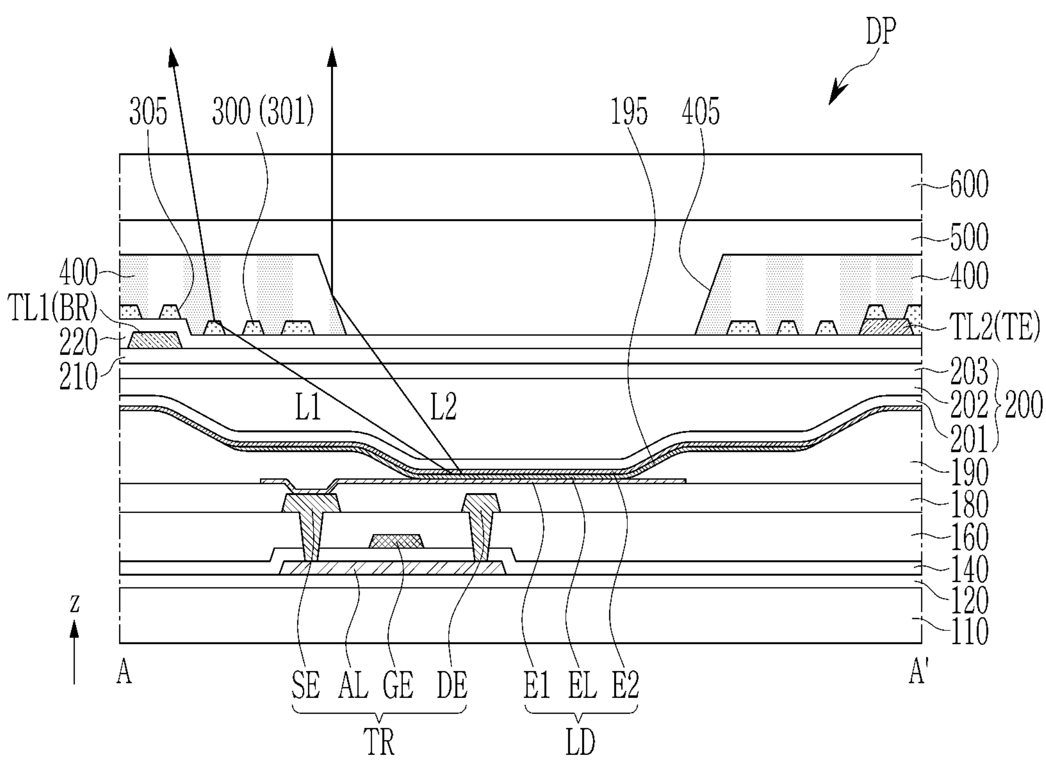
FIG. 3 is a schematic cross-sectional view of an embodiment of FIG. 2, taken along the line A-A'.
Figure 4:
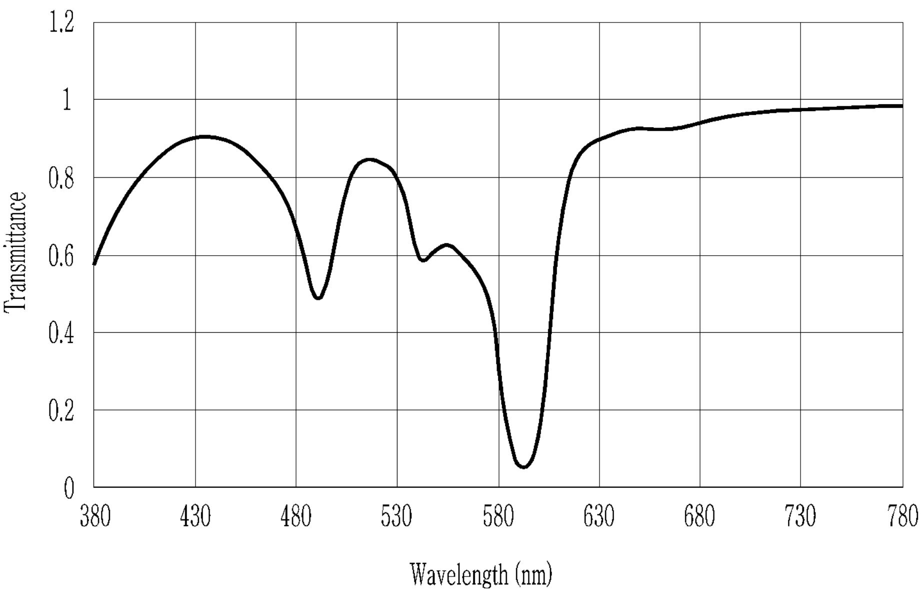
FIG. 4 is a graph that shows a transmission spectrum of a reflection control layer according to an embodiment.
Figure 5:
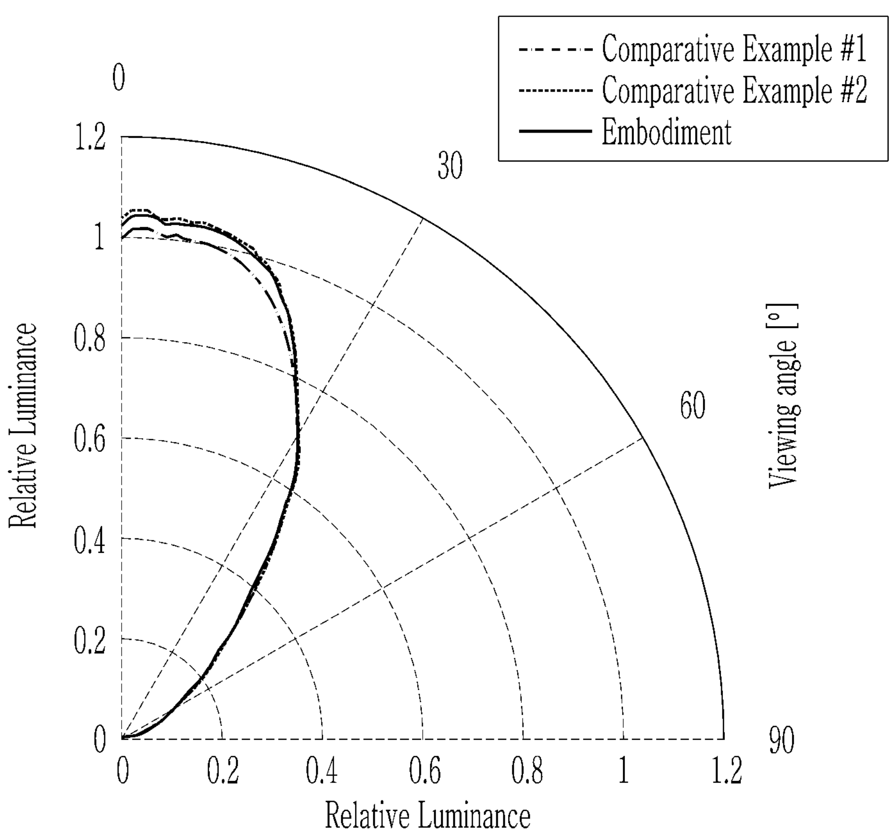
FIG. 5 is a graph showing radial distribution of display devices according to a comparative example and an embodiment.

FIG. 2 is a schematic top plan view of a pixel in the display panel according to an embodiment, and FIG. 3 is a schematic cross-sectional view of an embodiment of FIG. 2, taken along the line A-A'. FIG. 4 is a graph that shows a transmission spectrum of a reflection control layer according to an embodiment, FIG. 5 is a graph showing radial distribution of display devices according to a comparative example and an embodiment.

FIG. 2 shows one pixel PX and a light extraction pattern 300 around the pixel PX. Referring to FIG. 2 and FIG. 3, the display panel DP includes a substrate 110 and several layers, wires, and elements formed on the substrate 110. Although a plurality of pixel PXs are in the display area DA of the display panel DP, one pixel PX will be briefly illustrated and described in order to avoid making the description overly complex. Although each pixel PX includes transistors, a capacitor, and a light emitting element LD, the structure of the display panel DP will be described focusing on one transistor TR and one light emitting element LD connected to the transistor TR.

The substrate 110 may be a flexible substrate including a polymer such as polyimide, polyamide, and/or polyethylene terephthalate. The substrate 110 may include a barrier layer that prevents or reduces penetration of moisture, oxygen, and/or the like. For example, the substrate 110 may include at least one polymer layer and at least one barrier layer, and the polymer layer and the barrier layer may be alternately stacked. The lowermost layer of the substrate 110 may be a polymer layer and the uppermost layer may be a barrier layer. The barrier layer may include an inorganic insulating material such as a silicon oxide ($SiO_x$), a silicon nitride ($SiN_x$), a silicon oxynitride ($SiO_xN_y$), and/or the like. The substrate 110 may also be a glass substrate.

A buffer layer 120 may be on top of the substrate 110. The buffer layer 120 may block impurities that can diffuse from the substrate 110 to a semiconductor layer AL in a process of forming the semiconductor layer AL (or may reduce diffusion of such impurities), and planarize a surface of the substrate 110 to relieve stress of the semiconductor layer AL. The buffer layer 120 may be an insulation layer. The buffer layer 120 may include an inorganic insulating material such as a silicon oxide, a silicon nitride, and/or a silicon oxynitride, and may be a single layer or a plurality of layers.

The semiconductor layer AL of the transistor TR may be on the buffer layer 120. The semiconductor layer AL may include a channel area, and a first area and a second area on both sides of the channel area. The semiconductor layer AL may include a semiconductor material such as polysilicon, an oxide semiconductor, and/or amorphous silicon.

A gate insulation layer 140 may be on the semiconductor layer AL. The gate insulation layer 140 may include an inorganic insulating material such as a silicon oxide, a silicon nitride, and/or a silicon oxynitride, and may be a single layer or a plurality of layers.

A gate conductive layer, which may include a gate electrode GE, a gate line, and/or the like, may be on the gate insulation layer 140. The gate conductive layer may include molybdenum (Mo), aluminum (Al), copper (Cu), titanium (Ti), and/or the like, and may be a single layer or a plurality of layers.

An interlayer insulation layer 160 may be on the gate insulation layer 140 and the gate conductive layer. The interlayer insulation layer 160 may include an inorganic insulating material such as a silicon oxide, a silicon nitride, and/or a silicon oxynitride, and may be a single layer or a plurality of layers.

On the interlayer insulation layer 160, a data conductive layer that may include a first electrode SE and a second electrode DE of transistor TR, a data line, a driving voltage line, and/or the like may be located. The first electrode SE and the second electrode DE may be connected to a first area (e.g., a source region) and a second area (e.g., a drain region) of the semiconductor layer AL through contact holes formed in the interlayer insulation layer 160 and the gate insulation layer 140, respectively. The data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or the like, and may be a single layer or a plurality of layers. For example, the data conductive layer may have a triple layer structure such as titanium (Ti)-aluminum (Al)-titanium (Ti).

The gate electrode GE, the first electrode SE, and the second electrode DE may form the transistor TR along with the semiconductor layer AL. The illustrated transistor TR is a top-gate type (or kind), but the structure of the transistor may be variously changed.

A planarization layer 180 may be on the interlayer insulation layer 160 and the second conductor. The planarization layer 180 may be an organic insulation layer. For example, the planarization layer 180 may include a general-purpose polymer such as poly(methyl methacrylate) and/or polystyrene, a polymer derivative having a phenolic group, organic insulating materials such as an acryl-based polymer, an imide-based polymer (e.g., polyimide), siloxane-based polymers, and/or the like.

A pixel electrode E1 of the light emitting element LD may be on the planarization layer 180. The pixel electrode E1 is connected to the first electrode SE of the transistor TR through a contact hole formed in the planarization layer 180, and may receive a driving current that controls the luminance of the light emitting element LD. The transistor TR to which the pixel electrode E1 is connected may be a driving transistor or a transistor electrically connected to the driving transistor. The pixel electrode E1 may include a metal such as silver (Ag), nickel (Ni), gold (Au), platinum (Pt), aluminum (Al), copper (Cu), aluminum neodymium (AlNd), and/or aluminum nickel lanthanum (AlNiLa). The pixel electrode E1 may include a transparent conductive material such as an indium tin oxide (ITO) and/or an indium zinc oxide (IZO). The pixel electrode E1 may be multi-layered, and may have, for example, a triple layer structure of ITO-silver (Ag)-ITO.

A pixel definition layer 190 may be on the planarization layer 180 and the pixel electrode E1. The pixel definition layer 190 may have an opening 195 overlapping the pixel electrode E1, and the opening 195 may define a pixel area. The pixel definition layer 190 may be called a bank or a partition. The pixel definition layer 190 may include a general-purpose polymer such as poly(methyl methacrylate) and/or polystyrene, a polymer derivative having a phenolic group, organic insulating materials such as an acryl-based polymer, an imide-based polymer (e.g., polyimide), siloxane-based polymers, and/or the like.

An emission layer EL may be on the pixel electrode E1, and a common electrode may be on the emission layer EL. The emission layer EL may be within the opening 195, but may include a portion outside the opening 195. The emission layer EL may include a material layer that uniquely emits light of primary colors such as red, green, and blue. In addition to the emission layer EL, functional layers such as a hole injection layer (HIL), a hole transport layer (HTL), an electron transport layer (ETL), and an electron injection layer (EIL) may be on the pixel electrode E1. For example, the hole injection layer and/or the hole transport layer may be between the pixel electrode E1 and the emission layer EL, and the electron transport layer ETL and/or the electron injection layer may be on the emission layer EL.

A common electrode E2 may be on the emission layer EL. The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and/or lithium (Li). The common electrode E2 may include a transparent conductive oxide (TCO) such as an indium tin oxide (ITO) and/or an indium zinc oxide (IZO).

The pixel electrode E1, the emission layer EL, and the common electrode E2 may form a light emitting element LD, which may be an organic and/or inorganic light emitting diode. The light emitting element LD may emit blue light, green light, or red light. The light emitting element LD may emit white light. The pixel electrode E1 and the common electrode may be an anode and a cathode of the light emitting element LD, respectively, or vice versa.

An encapsulation layer 200 may be on the common electrode E2. The encapsulation layer 200 may encapsulate the light emitting element LD to prevent or reduce penetration of moisture and/or oxygen from the outside. The encapsulation layer 200 may be a thin film encapsulation layer including at least one inorganic layer and at least one organic layer. For example, the encapsulation layer 200 may have a triple layer structure of an inorganic layer 201, an organic layer 202, and an inorganic layer 203.

A first insulation layer 210 may be positioned on the encapsulation layer 200. The first insulation layer 210 may cover the encapsulation layer 200 to protect the encapsulation layer 200 and prevent or reduce moisture permeation. The first insulation layer 210 may reduce parasitic capacitance between the common electrode E2 and touch conductive layers TL1 and TL2. The first insulation layer 210 may include an inorganic insulating material such as a silicon nitride, an aluminum nitride, a zirconium nitride, a titanium nitride, a hafnium nitride, a tantalum nitride, a silicon oxide, an aluminum oxide, a titanium oxide, a tin oxide, and/or a cerium oxide.

A first touch conductive layer TL1, which may include a bridge BR, may be on the first insulation layer 210, and a second insulation layer 220 may be on the first touch conductive layer TL1. A second touch conductive layer TL2 that may include a touch electrode TE may be on the second insulation layer 220. The first insulation layer 210, the first touch conductive layer TL1, the second insulation layer 220, and the second touch conductive layer TL2 may form a touch sensor layer. The display panel DP may not include the touch sensor layer.

The touch electrode TE may include first touch electrodes and second touch electrodes forming mutual sensing capacitors. The bridge BR may electrically connect the first touch electrodes or the second touch electrodes. For example, the first touch electrodes that are separated from each other while being adjacent to each other are connected to the bridge BR through contact holes formed in the second insulation layer 220, and may be electrically connected through the bridge. The first and second touch conductive layers TL1 and TL2 may have a mesh shape having an opening overlapping an opening 195 of the pixel definition layer 190.

The first and second touch conductive layers TL1 and TL2 include metals such as aluminum (Al), copper (Cu), titanium (Ti), molybdenum (Mo), silver (Ag), chromium (Cr), and/or nickel (Ni). The first and second touch conductive layers TL1 and TL2 may include a conductive nanomaterial such as silver nanowire and/or carbon nanotubes. The first and second touch conductive layers TL1 and TL2 may be a single layer or a multilayer, and may have, for example, a triple layer structure such as titanium (Ti)-aluminum (Al)-titanium (Ti).

The second insulation layer 220 may include an inorganic insulating material such as a silicon nitride, an aluminum nitride, a zirconium nitride, a titanium nitride, a hafnium nitride, a tantalum nitride, a silicon oxide, a silicon oxynitride, an aluminum oxide, a titanium oxide, a tin oxide, and/or a cerium oxide. The second insulation layer 220 may include an organic insulating material such as acryl-based resin, methacrylic resin, polyisoprene, a vinyl-based resin, an epoxy-based resin, a urethane-based resin, a cellulose-based resin, and/or a perylene-based resin.

A light extraction pattern 300 may be on the second insulation layer 220 as a structure for improving light extraction. The light extraction pattern 300 may be provided so as to not overlap the opening 195 of the pixel definition layer 190 corresponding to a light emitting area of the light emitting element LD. The light extraction pattern 300 may have a mesh shape or a lattice shape, for example, like a waffle pattern. The light extraction pattern 300 may have various suitable cross-sectional shapes, and the cross-sectional shape of a portion 301 forming the mesh or the lattice may have a cross-sectional shape of an approximate trapezoid, as shown in the drawings (e.g., FIG. 3). The light extraction pattern 300 may include openings 305 and/or grooves corresponding to holes in a mesh shape or a lattice shape.

The light extraction pattern 300 may be light transmissive. Here, the light transmittance may mean that the transmittance of visible light in the third direction z is about 50% or more, about 60% or more, or about 70% or more. The light extraction pattern 300 may include a light-transmitting organic insulating material. For example, the light extraction pattern 300 may include at least one selected from an acryl-based resin, a polyimide resin, a polyamide resin, and tris(8-hydroxyquinolinato)aluminum (Alq3). The light extraction pattern 300 may have a refractive index of about 1.40 to about 1.59, or about 1.40 to about 1.50.

The light extraction pattern 300 may refract, reflect, and/or diffract a portion of light L1 emitted in an oblique direction from the light emitting element LD to proceed forward. Accordingly, the light directed to the front of the display panel DP increases, the light emission efficiency can be improved, and color mixing between adjacent pixels PX can be reduced.

A reflection control layer 400 may be on the light extraction pattern 300. The reflection control layer 400 may cover the light extraction pattern 300 and may contact the light extraction pattern 300. Light emission efficiency can be improved by the light extraction pattern 300, but external light reflection can also increase. For example, the light extraction pattern 300 may reflect light incident to the display panel DP from the outside of the display panel DP, which may result in display degradation. The reflection control layer 400 may absorb a part of external light incident on the light extraction pattern 300 and a part of external light reflected by the light extraction pattern 300, thereby reducing reflection of external light.

In order to not increase or deteriorate the color reproducibility of the display device 1, the reflection control layer 400 is formed of a reflection control material that can well absorb light of a wavelength other than the dominant wavelength or peak wavelength of light emitted from the light emitting element LD, and/or such reflection control material may be dispersed. For example, the reflection control layer 400 may include a dye such as tetraazaporphyrin (TAP), and may be formed by mixing the dye together with a resin.

The reflection control layer 400 contains a reflection control material that absorbs light of a wavelength (e.g., about 480 nm to about 620 nm) that has a more sensitive effect on luminance among visible light than light of other wavelengths such that it may be suitable to reduce external light reflection, which can be recognized by users. For example, because luminance L of light having a spectrum of s is $L=683\times\int s\times\bar{y}d\lambda$ (where $\bar{y}$ is a color matching function of the XYZ colorimetric system), luminance of the reflected light can be reduced when a material having high absorption is used only in a wavelength region with a large $\bar{y}$ value, and at the same time (or substantially the same time), a light loss of the light emitting element LD (e.g., a blue light emitting element that emits light in about a 460 nm region, a red light emitting element that emits light in about a 620 nm region) can be minimized or reduced. For example, when a spectrum of a target pixel is s and a transmission spectrum of a material is T (%), and when a ratio of s and y is set as follows, a material having a value of an s ratio is 80% or more and a value of a y ratio is 70% or less can be defined as a reflection control material.

$$s \text{ ratio} = \int T(\%)\times s\, d\lambda \Big/ \int s\, d\lambda,\ y \text{ ratio} = \int T(\%)\times \bar{y}\, d\lambda \Big/ \int \bar{y}\, d\lambda,$$

FIG. 4 shows a transmission spectrum of the reflection control layer 400 according to an embodiment. The reflection control layer 400 may absorb light of about a green wavelength to about an orange wavelength well, but a wavelength emitted by a green light emitting element (about a 525 nm region) may have a low absorption rate.

The reflection control layer 400 may include an opening 405 overlapping the opening 195 of the pixel definition layer 190 such that light emitted from the light emitting element LD forwardly is not absorbed by the reflection control layer 400. A width of the opening 195 of the reflection control layer 400 may be wider than that of the opening 195 of the pixel definition layer 190. In a planar view, the opening 195 may be within an opening 405 and the opening 405 may surround the opening 195. Although approximately quadrangular openings 195 and 405 are shown, the openings 195 and 405 may have various suitable planar shapes. In one or more embodiments, the reflection control layer 400 may also be formed in a region overlapping the opening 195 of the pixel definition layer 190 or may be formed over the entire display area DA.

The reflection control layer 400 may have a refractive index of about 1.30 to about 1.90. In order to prevent the light emitted from the light emitting element LD from being totally reflected without being refracted (or to reduce such total reflection without refraction) at an interface between the light extraction pattern 300 and the reflection control layer 400, the reflection control layer 400 may have a greater refractive index than the refractive index of the light extraction pattern 300. For example, the refractive index of the light extraction pattern 300 may be about 1.5 or less, and the refractive index of the reflection control layer 400 may be about 1.6 or more. Depending on the shape of the light extraction pattern 300, it may be suitable to improve light emission efficiency when the refractive index of the reflection control layer 400 is smaller than the refractive index of the light extraction pattern 300.

A flattening layer 500 may be on the reflection control layer 400. The flattening layer 500 may be formed over the entire display area DA. The flattening layer 500 may have the same refractive index as the refractive index of the reflection control layer 400 or may have a larger refractive index than the refractive index of the reflection control layer 400. When the flattening layer 500 has the same refractive index as the reflection control layer 400, the light refracted at the interface between the light extraction pattern 300 and the reflection control layer 400 may be passed through the display panel DP without being refracted at the interface between the reflection control layer 400 and the flattening layer 500. When the flattening layer 500 has a higher refractive index than the reflection control layer 400, the flattening layer 500 and the reflection control layer 400 form a micro-light-control pattern that controls a path of light emitted in an oblique direction to the light emitting element LD. The flattening layer 500 may have a smaller refractive index than the refractive index of the reflection control layer 400.

The flattening layer 500 may include an organic insulating material. A refractive index of the flattening layer 500 may be adjusted according to functional groups included in the flattening layer 500. The refractive index of the flattening layer 500 may be adjusted according to the type (or kind)

and content of nanoparticles included in the flattening layer 500. The flattening layer 500 may include a layer made of a material in which hollow silica is dispersed in an acryl-based resin and/or a siloxane-based resin, and the refractive index may be about 1.30 to about 1.53. The flattening layer 500 may include a layer made of an acryl-based resin containing fluorine (F), and in this case, the refractive index may be about 1.38 to about 1.53. The flattening layer 500 may include a layer made of a material containing a functional group such as an aromatic ring in a resin binder such as an acryl-based resin, a siloxane-based resin, and/or a polyimide. In this case, the refractive index is about 1.50 to about 1.65. The flattening layer 500 may include a layer made of an acryl-based resin containing halogen elements such as iodine (I) and bromine (Br) or elements such as sulfur (S), phosphorus (P), and/or silicon (Si), and in this case, the refractive index may be about 1.60 to about 1.70. The flattening layer 500 may include a layer made of an acryl-based resin containing nanoparticles such as titanium oxide ($TiO_x$), zirconium oxide ($ZrO_x$), aluminum oxide ($AlO_x$), and/or graphene. In this case, the refractive index may be from about 1.50 to about 1.90. The flattening layer 500 may include a layer made of an organometallic polymer including an acryl-based resin, a siloxane-based resin, and/or the like, and in this case, the refractive index may be about 1.60 to about 1.90. Here, the refractive index may be a value measured using light having a wavelength of about 589 nm (sodium D-line). For example, each refractive index disclosed herein may be measured at a wavelength of about 589 nm.

The flattening layer 500 may also be within the opening 405 of the reflection control layer 400. In this case, the flattening layer 500 may contact a side surface of the reflection control layer 400 defining the opening 405. The flattening layer 500 may cover an upper surface of the reflection control layer 400.

When the refractive index of the flattening layer 500 is greater than the refractive index of the reflection control layer 400, the low refractive index reflection control layer 400 and the high refractive index flattening layer 500 in the opening 405 may form a concave lens. Accordingly, the reflection control layer 400 and the flattening layer 500 may form a micro-light-control pattern over the display area DA. Light L2 emitted in an oblique direction from the light emitting element LD may be reflected, refracted, and/or diffracted by a condensing lens and changed to propagate toward the front. For example, the condensing lens may refract (totally reflect) the light L2 of the inclined direction emitted from the light emitting element LD in the front direction by an inclined surface of the opening 405. Because the light extraction pattern 300 is positioned more outside the light emitting element LD than the opening 405, it is possible to control the light L1 that spreads wider than the light L2 that can be controlled by the micro-light-control pattern. Therefore, the light emission efficiency and front luminance of the display device can be further improved, and color mixing between adjacent pixels can be reduced.

A reflection reduction layer 600 for reducing external light reflection may be on the flattening layer 500. The reflection reduction layer 600 may include a polarization layer and a phase delay layer. The cover window CW of the display device 1 may be on the reflection reduction layer 600, and the cover window CW may be attached to the display panel DP by an adhesive. In one or more embodiments, when the reflection control layer 400 is formed over the entire display area DA, the flattening layer 500 may be omitted.

Referring to FIG. 5, Embodiment represents radiation distribution on the display panel DP according to an embodiment including the light extraction pattern 300 and the reflection control layer 400 described above, and Comparative Example 1 shows radiation distribution on a display panel that does not include a light extraction pattern 300 and a reflection control layer 400, while Comparative Example 2 shows radiation distribution in a display panel that includes a light extraction pattern 300 and does not include a reflection control layer 400. Front luminance of display panels (Comparative Example 2 and Embodiment) including a light extraction pattern 300 was improved compared to a display panel (Comparative Example 1) not including a light extraction pattern 300 (Comparative Example 2 improved by 3.07% and Embodiment by 2.55% compared to Comparative Example 1). The display panel (Embodiment) including the reflection control layer 400 had a slightly reduced luminance compared to the display panel (Comparative Example 2) without the reflection control layer 400, but the reflectance was improved. For example, the reflectance of the front incident light using a D65 light source was 5.66% for Comparative Example 1 and 5.04% for Embodiment as a luminance reference. In this way, through the combination of the light extraction pattern 300 and the reflection control layer 400, it is possible to greatly reduce reflectance while improving light emission efficiency.

Hereinafter, display panels according to some embodiments will be mainly described with respect to differences from the display panel DP according to the above-described embodiments.

FIG. 6, FIG. 7, FIG. 8, FIG. 9, FIG. 10, and FIG. 11 are schematic cross-sectional views of an embodiment of FIG. 2, taken along the line A-A'.

Figure 6:
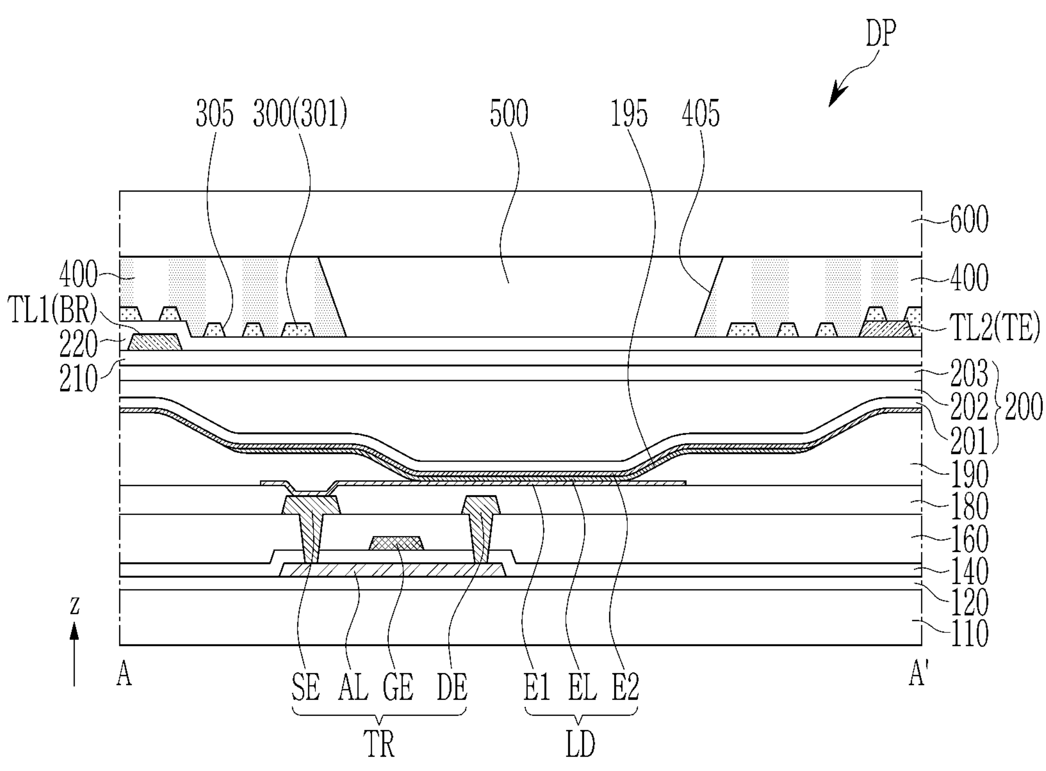
FIG. 6, FIG. 7, FIG. 8, FIG. 9, FIG. 10 and FIG. 11 are schematic cross-sectional views of an embodiment of FIG. 2, taken along the line A-A'.

Referring to FIG. 6, there is a difference from the embodiment of FIG. 3 in a position of the flattening layer 500. The flattening layer 500 may be within an opening 405 of a reflection control layer 400, and may not be on the reflection control layer 400. A top surface of the reflection control layer 400 and a top surface of the flattening layer 500 may form a substantially flat surface, and a height of the reflection control layer 400 and a height of the flattening layer 500 may be substantially equivalent. When the flattening layer 500 is on the reflection control layer 400 as in the embodiment of FIG. 3 and when the refractive indices of the reflection control layer 400 and the flattening layer 500 are different, the light refracted from an interface of the light extraction pattern 300 and the light interface of the reflection control layer 400 may be refracted again at the interface between the reflection control layer 400 and the flattening layer 500. When the refractive index of the flattening layer 500 is designed to be smaller than the refractive index of the reflection control layer 400, the interface between the reflection control layer 400 and the flattening layer 500 will refract light having a larger refraction angle than the incident angle, and thus, a possibility of total reflection and/or color mixing between adjacent pixels may be increased at an interface between layers on a light path. Accordingly, the flattening layer 500 may be formed such that the flattening layer 500 is not on the reflection control layer 400 in consideration of the reflection control layer 400 and the refractive index of the flattening layer 500.

Figure 7:
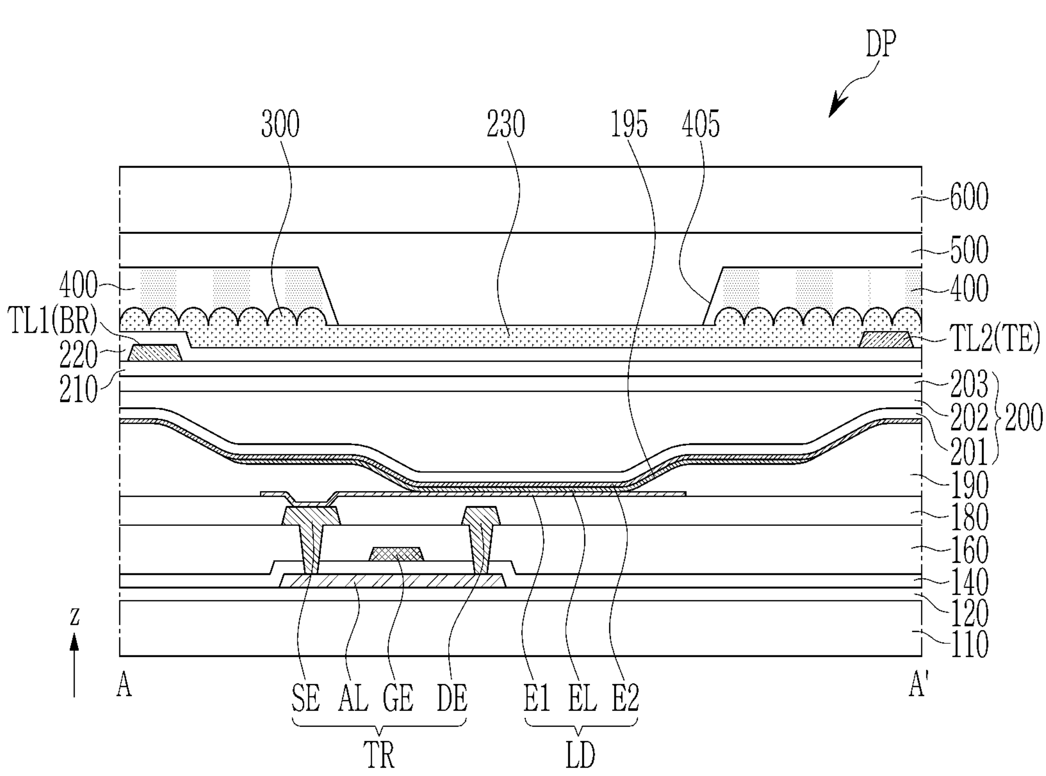

Referring to FIG. 7, the light extraction pattern 300 may have a microlens array shape. Each microlens has a convex shape when viewed from the front and may be approximately hemispherical, but may be of various suitable three-dimensional shapes. A portion of the light emitted in a diagonal direction from the light emitting element LD may be refracted, diffracted, and/or reflected by the light extraction pattern 300 of the microlens array shape and changed to proceed toward the front side. Reflection of external light by the light extraction pattern 300 can be reduced by positioning the reflection control layer 400 to overlap the light extraction pattern 300.

The light extraction pattern 300 may be formed by patterning a third insulation layer 230 that can be on the second insulation layer 220 and the second touch conductive layer TL2. As shown, the third insulation layer 230 may or may not overlap the opening 405 of the reflection control layer 400. The third insulation layer 230 may include an organic material such as an acryl-based resin and/or a siloxane-based resin. In one or more embodiments, the display panel DP may not include the third insulation layer 230, and the light extraction pattern 300 may be formed on the second insulation layer 220.

Figure 8:
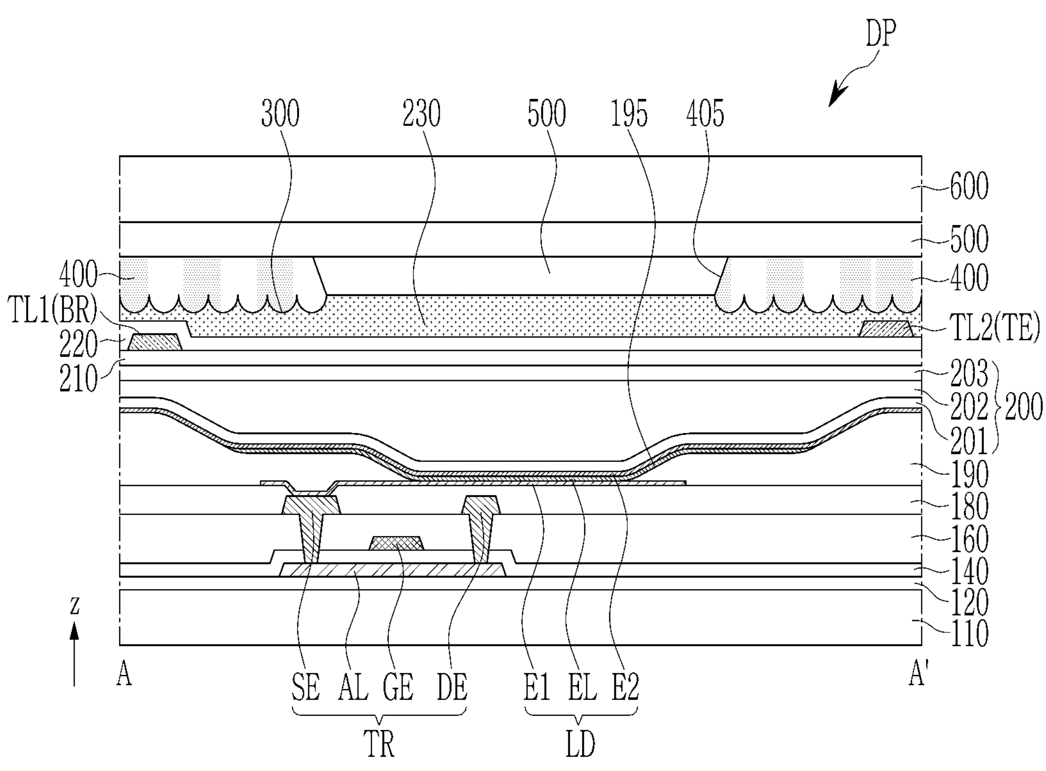

Referring to FIG. 8, the light extraction pattern 300 may have a microlens array shape of a reversed phase. In one or more embodiments, each microlens has a concave shape when viewed from the front and may have an approximate hemisphere surface shape, but may have various suitable three-dimensional shapes. The light extraction pattern 300 may be formed by patterning the third insulation layer 230 that can be on the second insulation layer 220 and the second touch conductive layer TL2. As shown, the third insulation layer 230 may or may not overlap the opening 405 of the reflection control layer 400.

Figure 9:
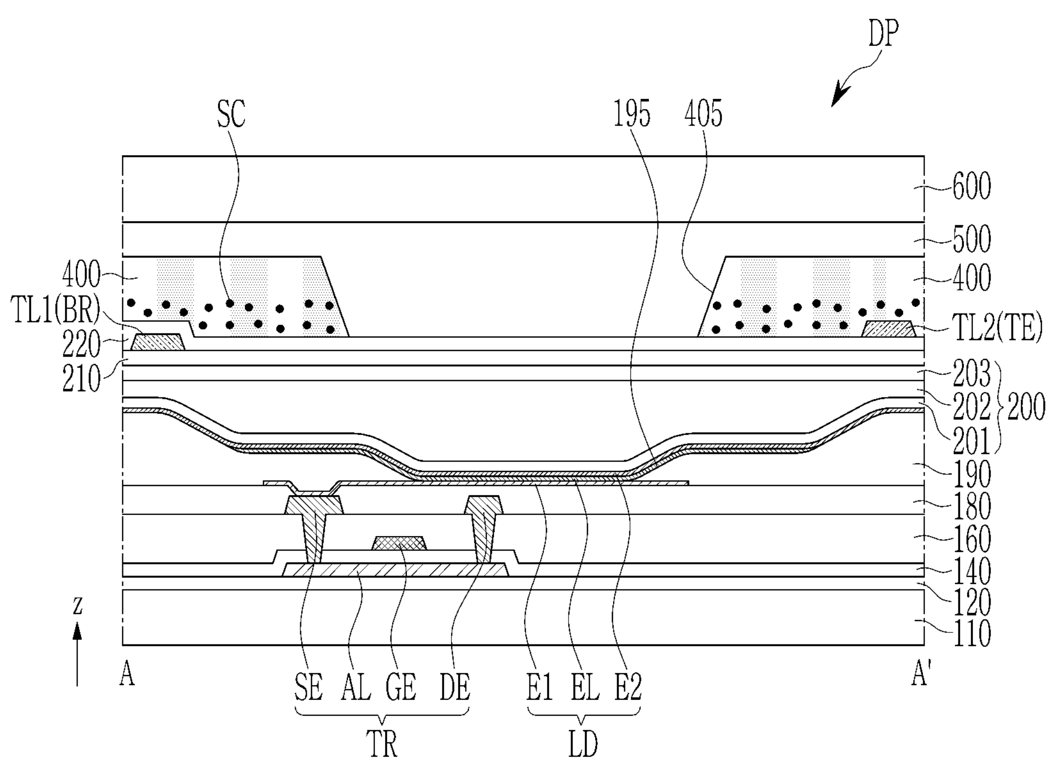

Referring to FIG. 9, the reflection control layer 400 may include scatterers SC (e.g., light scatterers SC). The scatterers SC may improve light emission efficiency by scattering light emitted from the light emitting element LD and incident on the reflection control layer 400. The scatterer SC may be a metal oxide particle and/or an organic particle. The metal oxide may be, for example, $TiO_2$, $ZrO_2$, $Al_2O_3$, $In_2O_3$, ZnO, $SnO_2$, and/or the like. A material of the organic particle may be an acryl-based resin, a urethane-based resin, and/or the like. The scatterer SC may scatter light in a random direction regardless of an incident direction of incident light. As a result, the light directed to the front of the display panel DP increases, and light emission efficiency can be improved. In addition, because light extracted by scattering may have a uniform (e.g., substantially uniform) radial distribution, color uniformity can be improved.

In order to reduce reflection of external light by the scatterers SC, the scatterers SC may be mainly in a lower region of the reflection control layer 400. For example, the scatterers SC may be distributed at about ⅔ or less, about ½ or less, about ⅓ or less, or about ¼ or less of a height of the reflection control layer 400. In one or more embodiments, the display panel DP may have a double layer structure including an insulation layer (e.g., a transparent organic insulation layer) in which scatterers SC are dispersed and a reflection control layer 400 is thereon.

Figure 10:
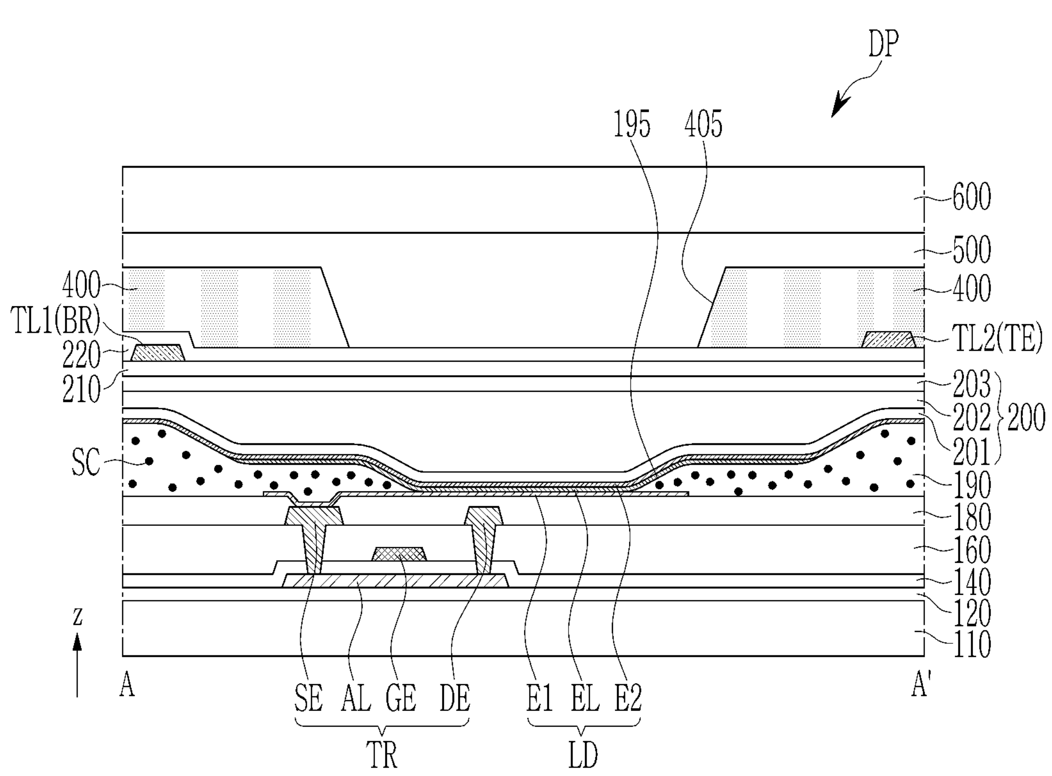

Referring to FIG. 10, the scatterers SC may be included in the pixel definition layer 190. The scatterers SC may improve light emission efficiency by scattering light emitted from the light emitting element LD and incident to the pixel definition layer 190. The reflection control layer 400 may overlap the pixel definition layer 190 and the scatterers SC to absorb a part of the external light incident on the scatterers SC and to absorb a part of the external light scattered by the scatterers SC, thereby reducing reflection of external light. As described, the scatterers SC may be in a layer that can scatter and emit light emitted in an oblique direction from the light emitting element LD and thus is lost inside the display panel DP. The scatterers SC may be included in the light extraction pattern 300 described above.

Figure 11:
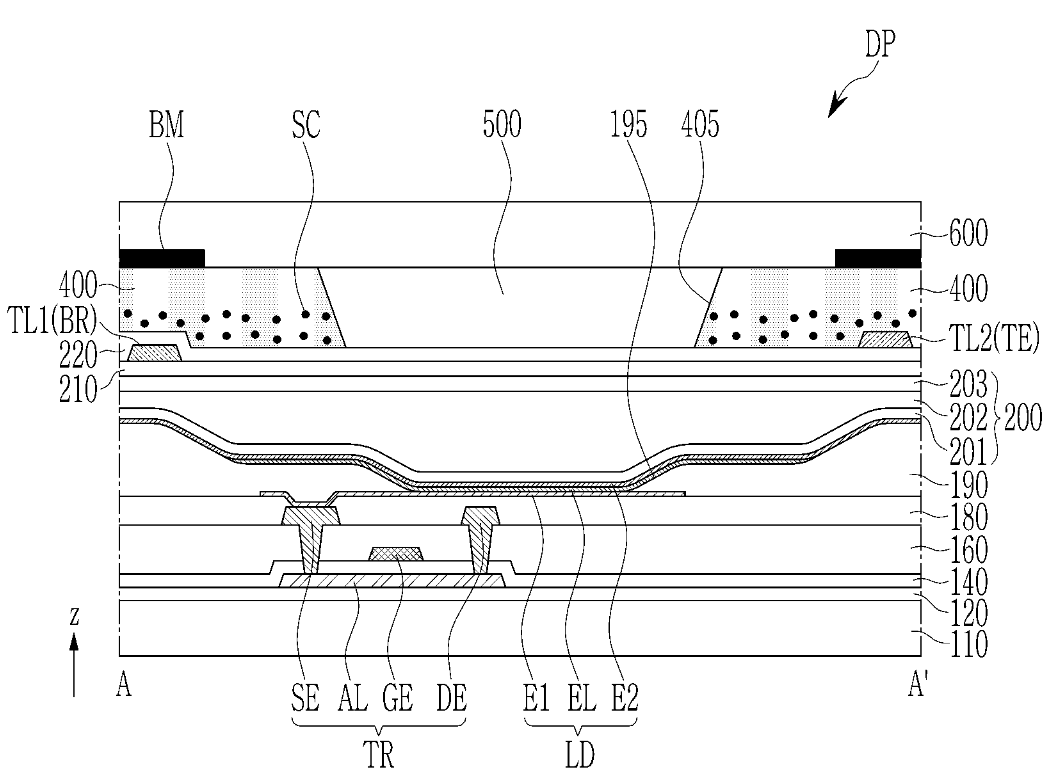

Referring to FIG. 11, a light blocking member BM may be on the reflection control layer 400. The light blocking member BM may overlap with the reflection control layer 400. The light blocking member BM may absorb a part of the external light incident on the scatterer SC and absorb a part of the external light reflected by the scatterer SC, thereby further reducing reflection of the external light. Although the light blocking member BM is shown as being between the reflection control layer 400 and the reflection reduction layer 600, it may be at another position, for example, on the reflection reduction layer 600. In one or more embodiments, even in a structure in which the above-described light extraction pattern 300 is formed, the light blocking member BM may be formed at a position overlapping with the reflection control layer 400.

While the subject matter of this disclosure has been described in connection with what is presently considered to be practical embodiments, it is to be understood that the present disclosure is not limited to the disclosed embodiments. On the contrary, it is intended to cover various suitable modifications and equivalent arrangements included within the spirit and scope of the appended claims, and equivalents thereof.

What is claimed is:

1. A display device comprising:
- a substrate;
- a transistor on the substrate;
- a pixel electrode electrically connected to the transistor;
- a pixel defining layer on the pixel electrode and having a first opening overlapping the pixel electrode;
- an emission layer on the pixel electrode;
- a common electrode on the pixel defining layer and the emission layer;
- an encapsulation layer on the common electrode;
- a light extraction pattern on the encapsulation layer and having a first refractive index; and
- a reflection control layer covering the light extraction pattern and having a second refractive index different from the first refractive index,
- wherein the first refractive index of the light extraction pattern is 1.40 to 1.59.

2. The display device of claim 1, wherein:
the reflection control layer contacts the light extraction pattern.

3. The display device of claim 1, wherein:
the light extraction pattern has a mesh shape or a lattice shape.

4. The display device of claim 3, wherein:
the light extraction pattern has a cross-section shape of a trapezoid.

5. The display device of claim 1, wherein:
the light extraction pattern comprises a microlens array.

6. The display device of claim 1, wherein:
the second refractive index is greater than the first refractive index.

7. The display device of claim 1, wherein:
the second refractive index is smaller than the first refractive index.

8. The display device of claim 1, wherein:
the reflection control layer comprises tetraazaporphyrin.

9. The display device of claim 1, wherein:
the reflection control layer has a second opening overlapping the first opening.

10. The display device of claim 9, further comprising a flattening layer at least in the second opening and having a third refractive index.

11. The display device of claim 10, wherein:

the third refractive index is the same as the second refractive index.

12. The display device of claim 10, wherein:

the third refractive index is greater than the second refractive index.

13. The display device of claim 10, wherein:

the flattening layer comprises a portion in the second opening and a portion on the reflection control layer.

14. The display device of claim 10, wherein:

an upper surface of the reflection control layer and an upper surface of the flattening layer form a flat surface.

15. The display device of claim 1, further comprising:

a touch conductive layer on the encapsulation layer; and an insulation layer on the touch conductive layer, wherein the light extraction pattern is on the insulation layer.

16. A display device comprising:

a substrate;

a transistor on the substrate;

a pixel electrode electrically connected to the transistor;

a pixel defining layer on the pixel electrode and having a first opening overlapping the pixel electrode;

an emission layer on the pixel electrode;

a common electrode on the pixel defining layer and the emission layer;

an encapsulation layer on the common electrode;

a reflection control layer on the encapsulation layer, comprising scatterers, and having a second opening overlapping the first opening; and a flattening layer in at least the second opening, wherein:

the scatterers are distributed at ⅔ or less of a height of the reflection control layer in the reflection control layer.

17. The display device of claim 16, wherein:

the reflection control layer comprises tetraazaporphyrin.

18. The display device of claim 16, further comprising:

a touch conductive layer on the encapsulation layer; and an insulation layer on the touch conductive layer, wherein the reflection control layer is on the insulation layer.

19. The display device of claim 16, further comprising a light blocking member overlapping the reflection control layer.

* * * * *